(12) United States Patent
Östman et al.

(10) Patent No.: US 6,650,876 B1
(45) Date of Patent: Nov. 18, 2003

(54) METHODS AND ARRANGEMENT RELATING TO A RADIO COMMUNICATION NETWORK

(75) Inventors: Thomas Östman, Spånga (SE); Tomas Stolt, Stockholm (SE); Ceylon Utterborn, Hässelby (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 477 days.

(21) Appl. No.: 09/636,328

(22) Filed: Aug. 10, 2000

(30) Foreign Application Priority Data

Aug. 24, 1999  (SE) ................................................ 9902984

(51) Int. Cl.⁷ ................................................ H04B 1/02
(52) U.S. Cl. ........................ 455/103; 455/115; 455/561; 455/67.1; 330/124 R
(58) Field of Search ................................. 455/450, 13.4, 455/67.1, 103, 115, 452, 453, 464, 561; 330/124 R

(56) References Cited

U.S. PATENT DOCUMENTS

| | | | |
|---|---|---|---|
| 4,618,831 A | 10/1986 | Egami et al. ............ 330/124 R |
| 5,491,837 A | 2/1996 | Haartsen ....................... 455/62 |
| 5,610,617 A | * 3/1997 | Gans et al. .................. 370/252 |
| 5,646,631 A | * 7/1997 | Arntz ........................... 342/373 |
| 5,726,978 A | * 3/1998 | Frodigh et al. ............. 370/252 |
| 5,764,104 A | 6/1998 | Luz ........................... 330/124 R |
| 5,809,423 A | * 9/1998 | Benveniste .................. 455/452 |
| 5,854,611 A | 12/1998 | Gans et al. .................. 342/373 |
| 5,987,037 A | * 11/1999 | Gans ........................... 370/480 |
| 6,091,934 A | * 7/2000 | Berman et al. ............ 455/13.4 |

FOREIGN PATENT DOCUMENTS

| | | |
|---|---|---|
| EP | 0786826 A2 | 7/1997 |
| WO | WO 9732444 A1 | 9/1997 |
| WO | WO 9741704 A1 | 11/1997 |

OTHER PUBLICATIONS

Blomqvist, F.; International–Type Search Report, Search Request No. SE99/01113, Jun. 21, 2000, pp. 1–4.

Kennington, P.B., et al.; "A Multi–Carrier Amplifier for Future Mobile Communications Systems," Sixth International Conference on Mobile Radio and Personal Communications, 199 pp. 151–156.

* cited by examiner

*Primary Examiner*—Nguyen T. Vo
*Assistant Examiner*—Tsuleun R Lei

(57) ABSTRACT

The present invention is related to a terrestrial cellular radio communication network comprising at least a first base station (BS1) in which a common set of multi carrier power amplifiers (409–412) are used to amplify radio signals transmitted by the first base station (BS1) in different cells. The invention enables reductions in the total maximum output power the first base station (BS1) needs to support when downlink power control functions, such as power control or discontinuous transmission, and/or Adaptive Channel Allocation are applied in the cells served by the first base station (BS1).

25 Claims, 9 Drawing Sheets

METHODS AND ARRANGEMENT RELATING TO A RADIO COMMUNICATION NETWORK

TECHNICAL FIELD OF THE INVENTION

The invention concerns methods and an arrangement related to a radio communication system. More specifically, the invention relates to a method of transmitting radio signals in a terrestrial cellular radio communication network using power amplification resources of a base station in a highly flexible and efficient way. The invention includes a terrestrial radio communication network comprising the necessary means to implement the method. The invention also includes a method of dimensioning the power amplification resources of the base station.

DESCRIPTION OF RELATED ART

A substantial part of the cost of a base station in a terrestrial radio communication system is related to the power amplification of radio signals transmitted by the base station.

Traditionally base stations have been equipped with so called single carrier power amplifiers (SCPA), each SCPA amplifying a single radio frequency carrier and designed so that it can deliver enough power to support communication with a mobile station positioned at the cell border.

An alternative way of designing the power amplification part of a base station, which is becoming increasingly common, is to equip the base station with so called multi carrier power amplifiers (MCPA) each capable of amplifying a radio signal comprising multiple radio frequency carriers. Typically a base station serving a single cell is equipped with one MCPA or one group of MCPAs working in parallell, while a base station serving a plurality of (sector) cells is equipped with one MCPA or one group of MCPAs working in parallell for each cell.

There are several advantages of using MCPAs instead of SCPAs in a base station. One advantage afforded by using MCPAs is that it is possible to benefit from functions such as Down link Power Control (DPC) and discontinuous transmission (DTX) which give statistical reductions in the total output power required to support a certain number of radio frequency carriers. Use of the DPC-function is estimated to give a statistical reduction in the required output power of about 4–6 dB while use of the DTX-function is estimated to cause a reduction of about 3–4 dB, in total a reduction of upto about 10 times. This means that an MCPA designed to support a certain number of carriers can be designed to deliver significantly less output power than the total output power required if a plurality of SCPAs were to support the same number of carriers.

In order to achieve the full statistical reduction afforded by the DPC- and DTX-functions, it is however necessary that the number of radio frequency carriers in the cell is high.

U.S. Pat. No. 5,854,611 discloses a base station, e.g. an Advanced Mobile Phone Service (AMPS) base station, serving a single cell in which a plurality of narrow antenna beams, e.g. 10 beams, are used to provide radio coverage in the cell. The base station comprises a first power sharing network coupled to a plurality of linear power amplifiers, which in turn are coupled to a second power sharing network. The first power sharing network equally distributes a received input signal from one of its input ports to the plurality of linear power amplifiers coupled thereto in substantially equal power levels and being staggered in phase relative to one another. The linear amplifiers independently amplify each respective output signal from the first power network. The second power sharing network receives the phase staggered amplified signals and provides an output signal having an average power level relative to the combined power level of the phase staggered amplified input signals to the second power sharing network. The output signal from the second power sharing network is then radiated in one of the narrow antenna beams. The base station and antenna system disclosed in U.S. Pat. No. 5,854,611, provides the advantages associated with the use of narrow antenna beams while avoiding the need for poorly utilized dedicated power amplifiers for each individual narrow antenna beam.

U.S. Pat. No. 4,618,813 describes a power amplifying apparatus in which signals to a plurality of input terminals, which are to be individually provided to a plurality of output terminals, share the sum of the output power capacities of a plurality of amplifiers. The patent specification briefly discusses an application of the power amplifying apparatus in a multi-beam satellite communication system

SUMMARY OF THE INVENTION

The problem dealt with by the present invention is how to provide a cost efficient and flexible way of performing radio signal power amplification in a base station in a terrestrial radio communication network.

The problem is solved essentially by a method and arrangement in which a common set of multi carrier power amplifiers are used to amplify radio signals transmitted by a base station in different cells.

More specifically, the problem is solved in the following manner. A first set of low power radio signals comprising at least a first and a second radio signal is generated. The first radio signal is generated so as to consist of radio carrier components having frequencies allocated for use in a first cell of the cellular radio communication network. The second radio signal is generated so as to consist of radio carrier components having frequencies allocated for use in a second cell of the cellular radio communication network. A second set of amplified radio signals corresponding to the first set of radio signals is generated by amplifying the first set of radio signals using the common set of multi carrier power amplifiers. The second set of amplified radio signals is radiated in associated antenna beams, wherein the amplified radio signal corresponding to the first radio signal is radiated in an antenna beam associated with the first cell and the amplified radio signal corresponding to the second radio signal is radiated in an antenna beam associated with the second cell.

A general object of the invention is to provide a cost efficient and flexible way of performing radio signal power amplification in a base station in a terrestrial radio communication network.

Another object is to reduce the maximum total output power a base station needs to deliver in order to service a certain number of radio carriers or to serve more radio carriers given a certain maximum total output power.

Still another object is to enable reallocation of output power between different cells served by a base station.

Yet another object is to enable adaptation of both the available output power and number of radio carrier frequencies in a cell as demand for capacity changes in the cell.

A general advantage afforded by the invention is that it provides a cost efficient and flexible way of performing radio signal power amplification in a base station in a terrestrial radio communication network.

A more specific advantage offered by the invention is that the total maximum output power of a base station servicing a certain number of radio carriers can be reduced. This implies that equipment cost, power consumption, size and weight of the base station can be reduced.

Still another advantage provided by the invention is that output power can be reallocated between different cells served by a base station.

Yet another advantage of the invention is that both the available output power and number of radio carrier frequencies in a cell can be adapted as demand for capacity changes in the cell.

The invention will now be described in more detail with reference to exemplifying embodiments thereof and also with reference to the accompanying drawings.

DETAILED DESCRIPTION OF THE EMBODIMENTS

Figure 1:
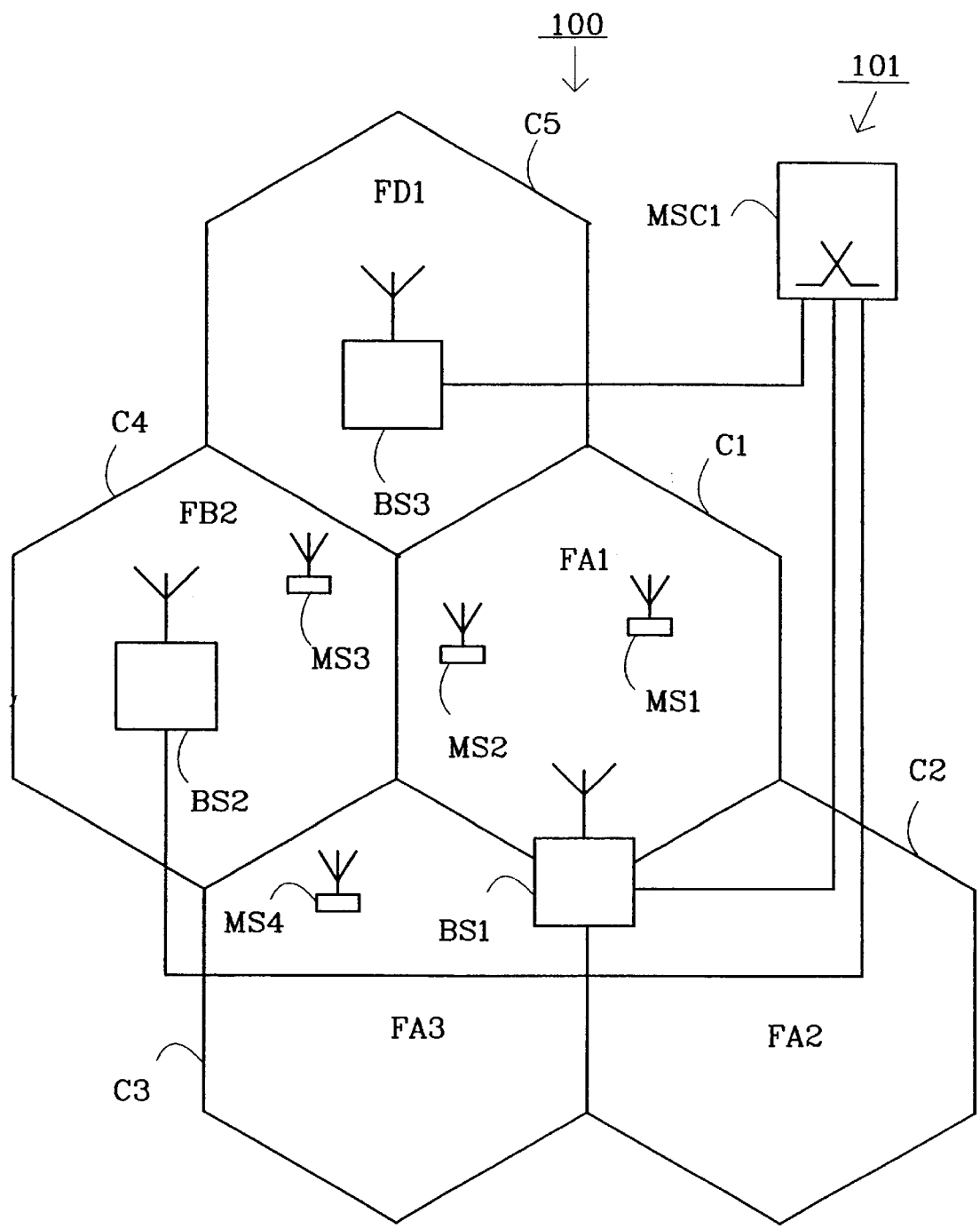
FIG. 1 is a schematic view of parts of a terrestrial cellular radio communication network.

FIG. 1 illustrates parts of a radio communication system 100 comprising a terrestrial cellular radio communication network 101, referred to as cellular network 101 in the following, and a set of mobile stations MS1–MS4. In the radio communication system 100 illustrated in FIG. 1, communication between the cellular network 101 and the mobile stations MS1–MS4 is based on the TIA/EIA IS-136 air interface specifications. The cellular network 101 comprises a mobile services switching centre MSC1 and base stations BS1–BS3 connected to the mobile services switching centre MSC1. The base stations BS1–BS3 provide radio coverage in a geographical area served by the mobile services switching centre MSC1. The mobile services switching centre MSC1 is responsible for switching calls to and from mobile stations MS1–MS4 located in the geographical area served by the mobile services switching centre MSC1. Note that FIG. 1 only includes elements deemed necessary for illustrating the present invention and that a typical cellular network comprises several mobile services switching centres, a greater number of base stations as well as other types of nodes such as home location registers.

Frequency reuse is a key concept in cellular networks. This is a technique whereby groups of frequencies are allocated for use in regions of limited geographic coverage known as cells. Cells containing equivalent groups of frequencies are geographically separated to allow callers in different cells to simultaneously use the same frequency without interfering with each other. FIG. 1 illustrates how the geographical area served by the mobile services switching centre MSC1 is divided into five cells C1–C5. In each cell C1–C5 radio coverage is provided by one of the base stations BS1–BS3 respectively. The base stations BS2 and BS3 provide radio coverage in the cells C4 and C5 respectively, i.e. the base stations BS2 and BS3 provide radio coverage in one cell each, while the base station BS1, referred to as the first base station BS1 in the following, provides radio coverage in the three cells C1–C3, i.e. the base station BS1 provides radio coverage in a plurality of cells. Transmissions of radio signals from any one of the base stations BS1–BS3 to the mobile stations MS1–MS4 are said to occur in the downlink direction while transmissions from any one of the mobile stations MS1–MS4 to any one of the base stations BS1–BS3 are said to occur in the uplink direction.

Figure 2:
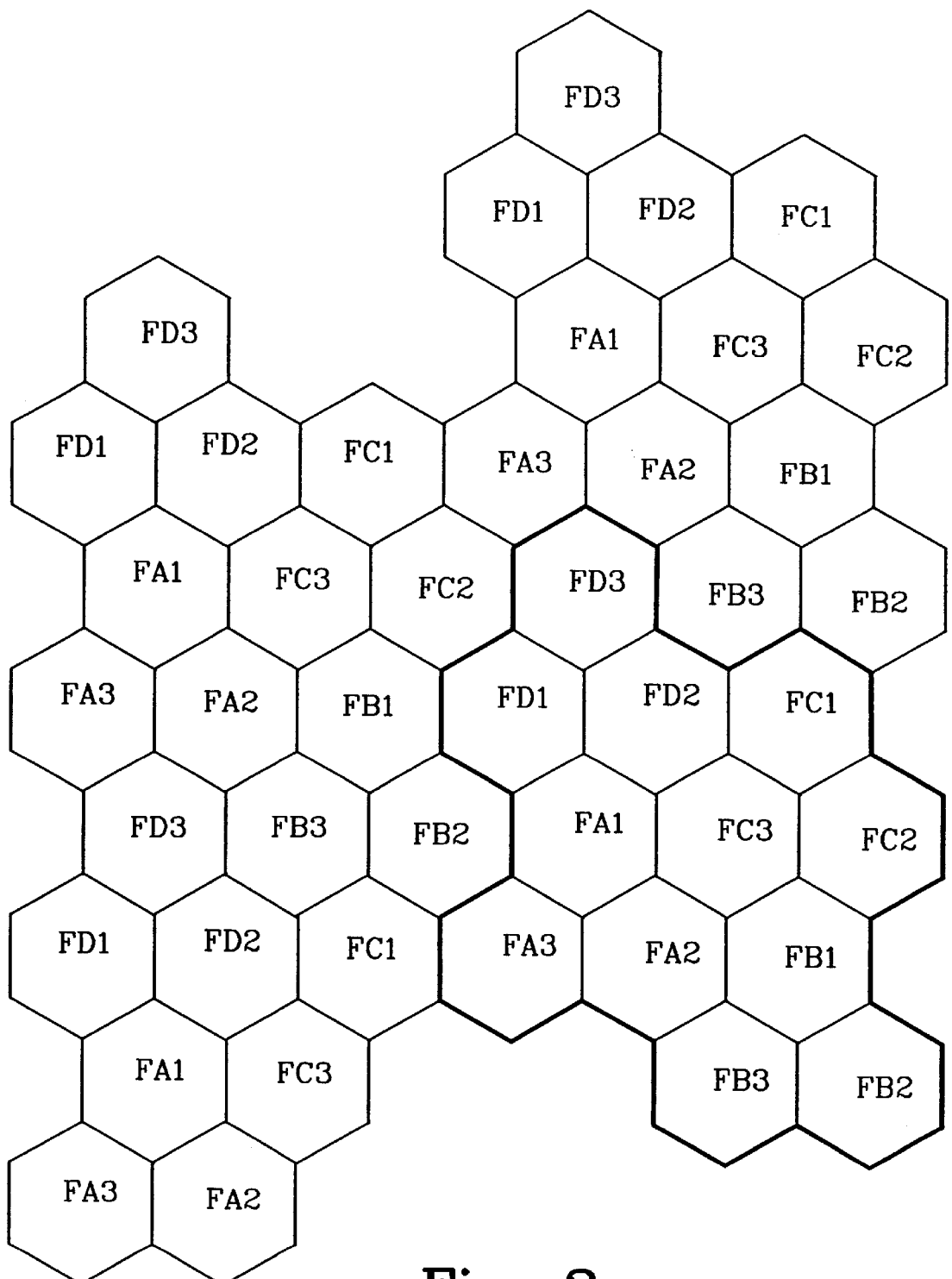
FIG. 2 is a view illustrating a "4/12" cell pattern for frequency reuse.

Frequency planning is the process by which individual radio frequencies are assigned to cells within the cellular network. Currently most frequency planning is done a priori, i.e. a fixed frequency plan is "hard-wired" in place by each cellular network operator. This is known as fixed channel allocation (FCA). FIG. 2 illustrates one example of a FCA-scheme in the form of a so called "4/12" cell pattern for frequency reuse. The "4/12" cell pattern is applied to the cellular network 101 of FIG. 1. In this reuse pattern, the total frequency band allocated to the cellular network 101 is divided into 12 frequency groups FA1–FA3, FB1–FB3, FC1–FC3 and FD1–FD3. Each cell is allocated a frequency group according to the pattern illustrated in FIG. 2, thus e.g. cells C1–C5 are allocated frequency groups FA1–FA3, FB2 and FD1 as illustrated in FIG. 1.

Adaptive channel allocation (ACA) is a method of dynamically allocating frequencies througout a cellular network to maximise network capacity. Under an ACA-scheme, more frequencies would be allocated to busy cells from more lightly loaded cells. In addition, the channels can be allocated such that all links have satisfactory quality. A multitude of different ACA-schemes have been proposed such as the schemes proposed in the international patent application WO 97/32444 and the U.S. Pat. No. 5,491,837. It may be noted that there is a distinction between allocation of a frequency for use in a cell, i.e. making the frequency available for use in the cell and actually performing transmission of a radio frequency carrier using the allocated frequency. The two steps of allocating the frequency and actually using the frequency for radio transmission may however occur essentially simultaneously.

A substantial part of the cost of each base station BS1–BS3 in the cellular network 101 is related to the power amplification of radio signals transmitted by the base stations. The cost related to power amplification equipment is essentially proportional to the total maximum output power the base station is designed to deliver. Hence, it is important to utilize the available output power in the base station as efficient as possible and strive to minimise the total maximum output power required. Not only the equipment costs but also the power consumption, size and weight will be reduced as a consequence of the base station being designed to deliver less total maximum output power.

There are a number of known power reducing functions, such as power control and discontinuous transmission.

(alternatively called voice operated transmission), which when applied to a radio carrier causes a decrease in the average radio carrier signal power. These power reducing functions have been used to reduce the interference level in a cellular network and improve mobile station operation time by conserving battery power. When such power reducing functions are applied to radio carriers transmitted by a base station in the down link direction, they give statistical reductions in the total output power the base station needs to deliver in order to be able to support a certain number of radio carriers. The statistical reductions in the required total output power rely on the observation that if e.g. output power is individually set on each time slot on each carrier, it is highly improbable, if there are a sufficient number of radio carriers, that a worst case situation, where all radio carriers simultaneously requires maximum output power, will arise. Due to a very low probability for the worst case scenario, the base station need not be designed to provide enough output power to handle the worst case scenario. Instead the base station can be designed to provide enough output power to ensure that there is an acceptable probability, i.e. a sufficiently low but non-zero probability, for the occurence of situations where the base station cannot provide enough output power.

Figure 3:
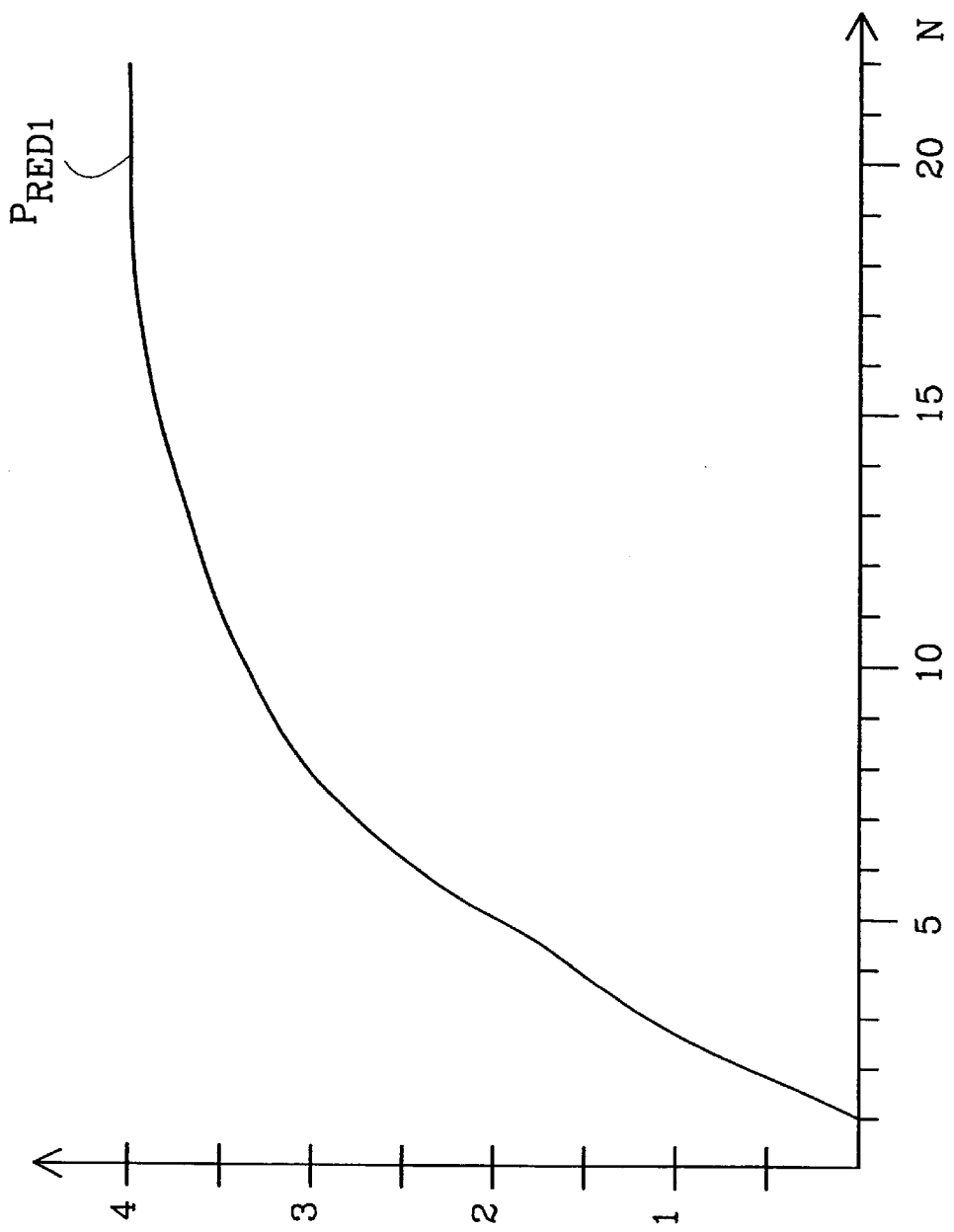
FIG. 3 is a diagram illustrating statistical reductions in required total maximum output power due to use of power reducing functions in the downlink direction.

FIG. 3 is a diagram illustrating an estimate of the statistical reductions in required total output power PREDI (in dB) as a function of the number N of radio carriers when power control is applied individually to each time slot on each radio carrier in the downlink direction.

As illustrated in FIG. 3, provided that the number of radio frequency carriers are sufficiently high, use of the downlink power control function is estimated to cause a statistical reduction in the required output power of about 4 dB. Thus, a power amplifier designed to support e.g. 15 radio carriers could be designed to deliver significantly less output power per radio carrier as compared to a power amplifier designed to support e.g. 5 radio carriers.

The present invention offers a way to further reduce the total maximum output power a base station is required to deliver in situations where there are to few radio carriers in a cell to fully benefit from the use of power reducing functions in the downlink direction.

A common situation occuring in terrestrial cellular radio communication networks like the cellular network 101 in FIG. 1, is that capacity demand fluctuates from cell to cell over the course of a given time period. If, in an example scenario, cell C1 essentially covers a sports centre, cell C2 covers a shopping area and cell C3 covers an office area, the capacity demand in the cells C1–C3 can be expected to exhibit significant fluctuations. Furthermore, at a given point in time the capacity demand will not be at its peak in all three cells simultaneously. Capacity demand in cell C1 will only be high when there is some major event at the sports centre, typically a few evenings a week. Capacity demand in cell C2 will only be high during shopping hours, e.g. lunch hours and early weekday evenings. Capacity demand in cell C3 will only be high during office hours. By applying some kind of Adaptive Channel Allocation scheme, the cellular network 101 would be able to adapt the set of frequencies allocated to each of the cells C1–C3 in response to changes in capacity demand in the cells. However, if e.g. cell C1 is allocated one or several additional frequencies due to an extreme capacity demand in connection with a soccer game, the first base station BS1 must be able to deliver enough output power in cell C1 to support downlink transmissions also on the additional frequencies. Thus, to benefit from the possibility offered by the ACA-scheme to allocate additional frequencies in the cell C1 to support the extreme capacity demand, the first base station BS1 would need to be designed with spare output power capacity in cell C1 which is very seldom utilized.

The present invention offers a solution to the problem of enabling the first base station BS1 to provide enough output power in cell C1 to support the allocation of additional frequencies to cell C1 without requiring the first base station BS1 to be designed with under utilized spare output power capacity in cell C1.

The basic principle of the invention is to use a common set of multi carrier amplifiers to amplify radio signals transmitted by a base station in different cells of a terrestrial cellular network.

The basic principle of the invention can be applied in different embodiments of the invention to achieve further statistical reductions in required total maximum output power of a base station when downlink power reduction functions are used and/or to avoid the need to design the base station with spare output power capacity in cells to support allocation of additional frequencies using an Adaptive Channel Allocation scheme.

Using a common set of multi carrier power amplifiers to serve more than one cell instead of individual sets of multi carrier power amplifiers serving each individual cell, means that the common set of multi carrier power amplifiers handles an increased number of radio frequency carriers as compared to the number of radio frequency carriers each individual set of multi carrier power amplifiers would have handled. Hence, as already discussed in connection with FIG. 3, the use of the common set of multi carrier power amplifiers in combination with the use of downlink power reduction functions, such as downlink power control or discontinuous transmission, causes a reduction in the required total maximum output power of a base station.

Using a common set of multi carrier power amplifiers to serve more than one cell also enables a base station to distribute varying amounts of the total output power produced by the common set of multi carrier power amplifiers between the different cells. Hence, as long as the total power demand in all cells does not exceed the maximum output power the common set of multi carrier power amplifiers is able to produce, it is possible to distribute output power to a cell in support of additional frequencies allocated to that cell.

An examplifying first embodiment of the invention as applied in the terrestrial cellular radio communication network 101 illustrated in FIG. 1, will now be described while referring to FIG. 4 through FIG. 7.

Figure 4:
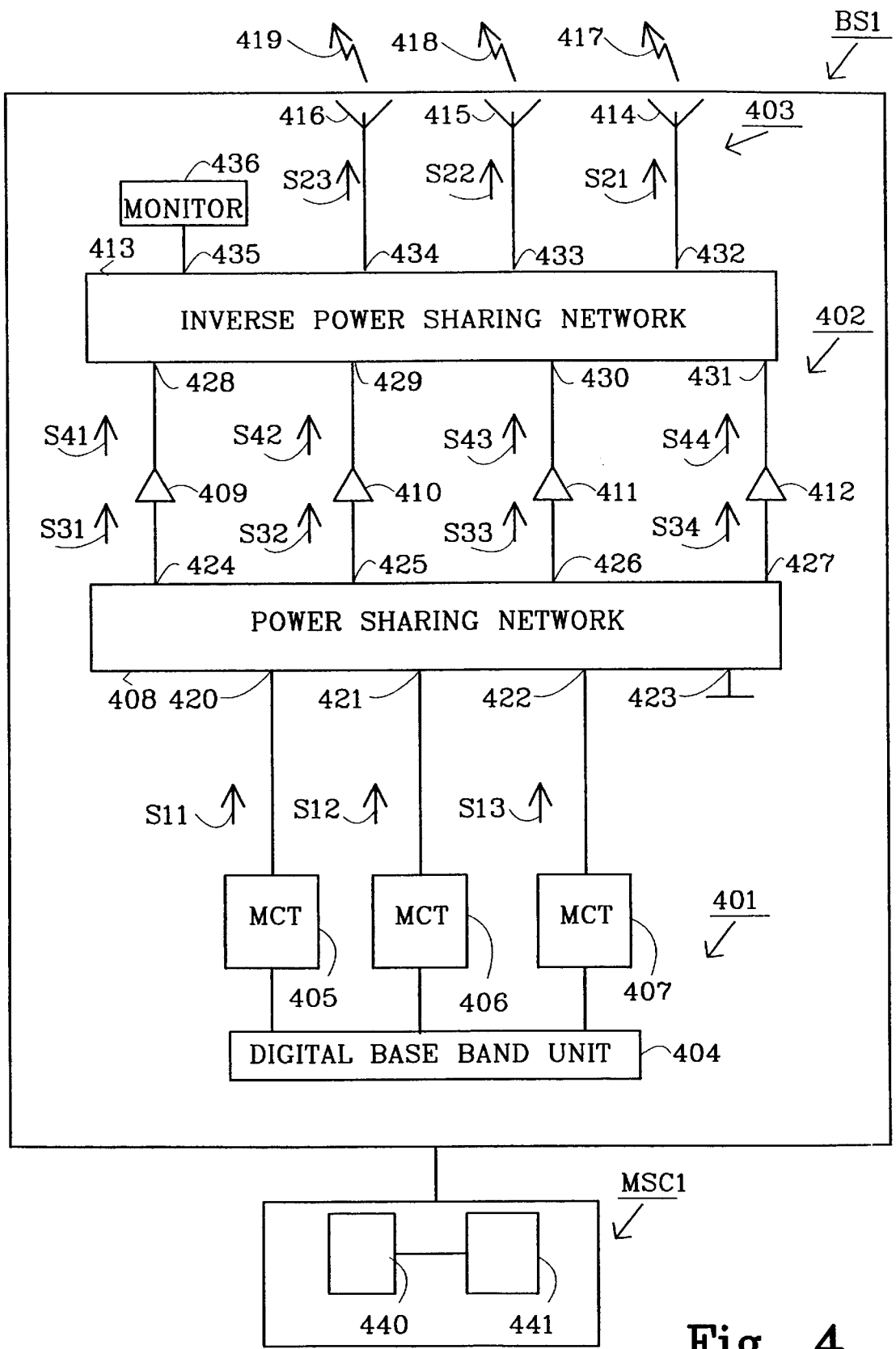
FIG. 4 is a block diagram illustrating details of the first base station and the mobile services switching centre in FIG. 1 according to a first embodiment of the invention.

FIG. 4 illustrates more details of the first base station BS1 and the mobile services switching centre MSC1 in accordance with the first embodiment of the invention.

The first base station BS1 comprises radio signal generating means 401, a power amplifying unit 402 and an antenna system 403.

The radio signal generating means includes a digital base band unit 404 connected to three multi carrier transceivers 405–407.

The power amplifying unit 402 includes a power sharing network 408 having a plurality of input ports 420–423 and output ports 424–427, a common set of multi carrier power amplifiers 409–412 each having an input and an output and an inverse power sharing network 413 having a plurality of input ports 428–431 and output ports 432–435. Each amplifier 409–412 is connected with its input port to one of the output ports 424–427 of the power sharing network 408 and is connected with its output port to one of the input ports 428–431 of the inverse power sharing network 413.

The antenna system 403 includes a first antenna 414, a second antenna 415 and a third antenna 416. The antennas 414–416 are each associated with a different one of the three cells C1–C3 and provides an antenna beam 417–419 covering the associated cell.

The first base station BS1 also comprises one or several control processors (not shown in FIG. 4) controlling the overall operation of the first base station BS1 and handling communication with the mobile services switching centre MSC1.

The mobile services switching centre MSC1 comprises one or several control processors 440 executing program instructions stored in one or several memory units 441.

The first base station BS1 and the mobile services switching centre MSC1 communicate with each other using e.g. an optical fibre or a radio link.

Figure 5A:
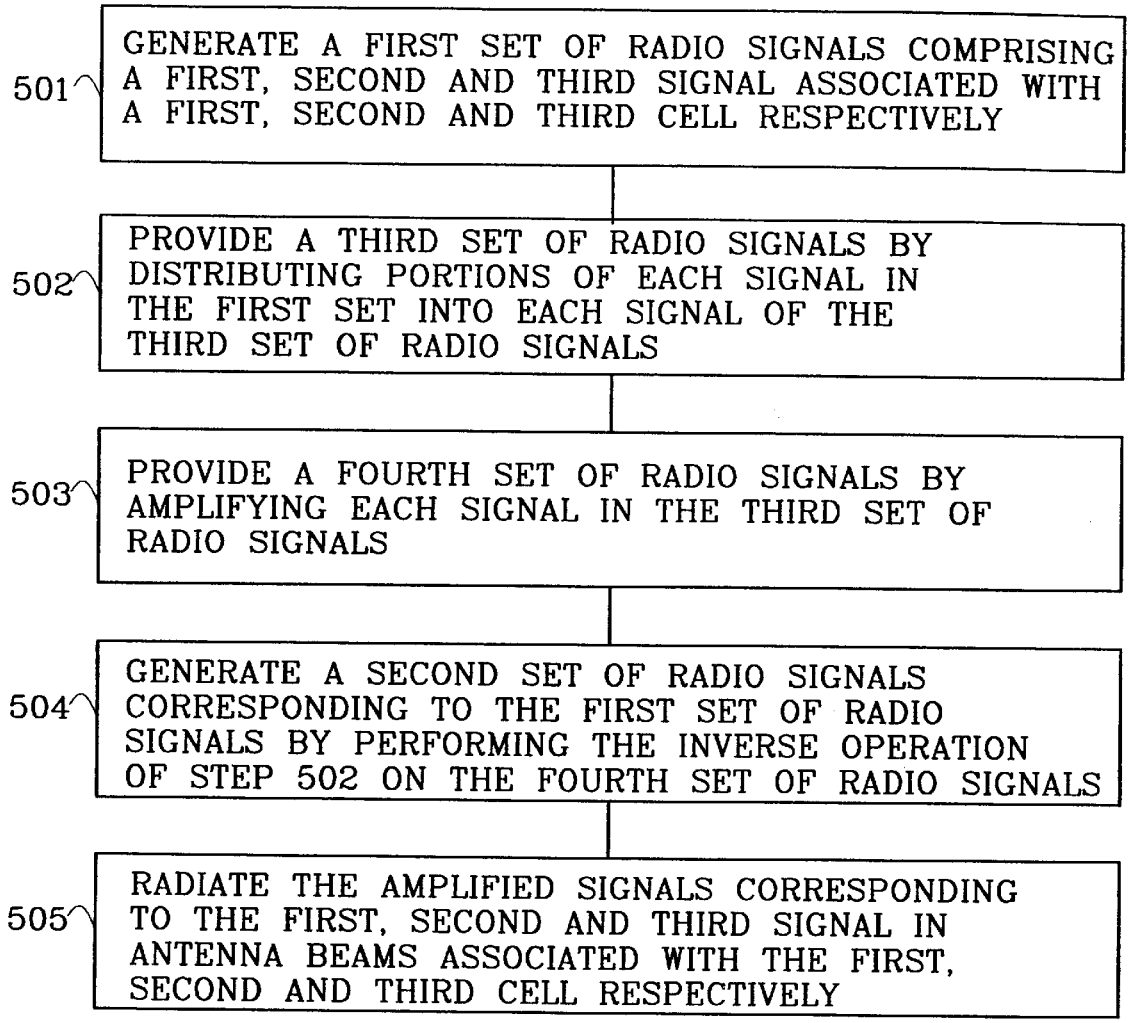
FIGS. 5A–5C are flow diagrams illustrating the method according to the first embodiment of the invention applied in the cellular network of FIG. 1.

FIG. 5A illustrates part of the method for transmitting radio signals in the cellular network 101 according to the examplifying first embodiment of the invention.

At step 501 a first set of low power radio signals S11–S13 is generated by the radio signal generating means 401. The first set of low power radio signals S11–S13 includes a first radio signal S11, a second radio signal S12 and a third radio signal S13. The first radio signal S11, which is associated with the first cell C1, is generated so as to consist of radio carrier components having frequencies allocated for use in the first cell C1. In a similar way the second radio signal S12, which is associated with the second cell C2, is generated so as to consist of radio signals having frequencies allocated for use in the second cell C2 and the third radio signal S13, which is associated with the third cell C3, is generated so as to consist of radio signals having frequencies allocated for use in the third cell C3.

The base band unit 404 receives instructions from the mobile services switching centre MSC1 concerning which radio carrier components should be included in each of the three signals S11–S13 and generates three digital base band signals corresponding to said signals S11–S13. The digital signals are passed to the three multi carrier transceivers 405–407 which generate the three signals S11–S13 by performing Digital-to-Analog and radio frequency conversion of the corresponding digital base band signal.

Steps 502–504 generate a second set of amplified radio signals S21–S23 corresponding to the first set of radio signals S11–S13 by amplification of the first set of radio signals S11–S13 in the power amplifying unit 402, i.e. the second set of radio signals S21–S23 consists of amplified versions of each signal in the first set of radio signals S11–S13.

At step 502, a third set of radio signals S31–S34 is provided by the power sharing network 408 on its output ports 424–427. The power sharing network 408 receives the first set of radio signals S11–S13 on its input ports 420–422 and distributes a portion of each signal in the first set of radio signals S11–S13 to each of its output ports 424–427. Each signal in the first set of radio signals S11–S13 is distributed in portions of substantially equal power levels and staggered in phase to each of the output ports 424–427. Thus, each of the signals S31–S34 in the third set of radio signals will contain an equal portion of e.g. the first radio signal S11. The portions of the first radio signal S11 in e.g. signals S31 and S32 will however be shifted in phase relative to each other.

At step 503, a fourth set of radio signals S41–S44 is provided by amplifying each signal in the third set of radio signals S31–S34 in one of the amplifiers in the common set of multi carrier power amplifiers 409–412.

At step 504, the second set of radio signals S21–S23 is provided by the inverse power sharing network 413 on its output ports 432–434. The inverse power sharing network 413 performs the inverse operation of the power sharing network 408 on the fourth set of radio signals S41–S44. Thus the inverse power sharing network 413 provides e.g. the signal S21, which is the signal in the second set of radio signals which corresponds to the first signal S1, by recombining the content of each signal in the third set S31–S34 which originates from the first radio signal S11.

At step 505, the second set of radio signals S21–S23 corresponding to the first set of radio signals S11–S13 is radiated in the respective associated antenna beam 417–419, i.e. signal S21, which is the amplified radio signal corresponding to the first radio signal S11, is radiated by the first antenna 414 in its antenna beam 417, signal S22, which is the amplified radio signal corresponding to the second radio signal S12, is radiated by the second antenna 415 in its antenna beam 418 and signal S23, which is the amplified radio signal corresponding to the third radio signal S13, is radiated by the third antenna 414 in its antenna beam 419.

Figure 6:
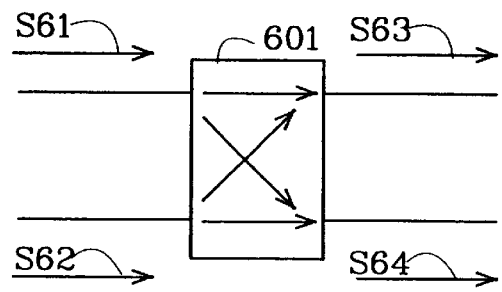
FIG. 6 is a block diagram illustrating a 180 degrees 3 dB hybrid coupler.
Figure 7:
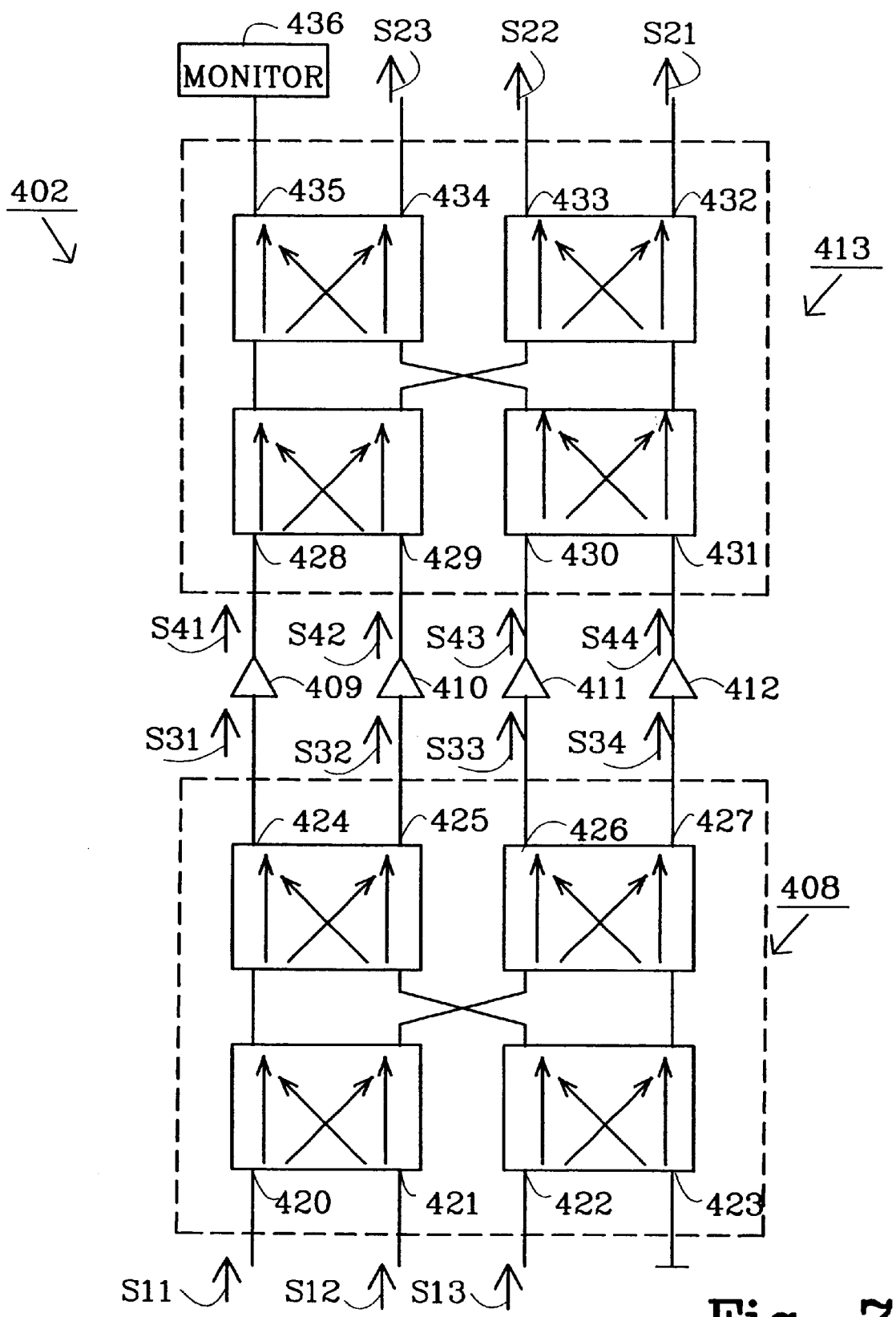
FIG. 7 is a block diagram illustrating a power amplification arrangement in the first base station.

FIG. 6 and FIG. 7 gives a detailed example how the power amplification unit 402 in FIG. 4 may be implemented.

FIG. 6 illustares a 180° 3 dB hybrid coupler 601. If the input signals to the hybrid coupler 601 are S61 and S62, the output signals S63 and S64 are:

$$S63=(1/\sqrt{2})*(S61-S62) \qquad (1)$$

$$S64=(1/\sqrt{2})*(S61+S62) \qquad (2)$$

FIG. 7 illustrates how the power sharing network 408 and the inverse power sharing network 413 may be designed as so called Butler matrixes using 180 ° 3 dB hybrid couplers 601.

As is apparent from both FIG. 4 and FIG. 7, the power sharing network 408 has four input ports 420–423, while only three of these input ports 420–422 are used to receive the signals in the first set of radio signals S11–S13.

The main reason for designing the power sharing network 408 and the inverse power sharing network 413 as Butler matrixes having four input ports and four output ports, is that Butler matrixes having $2^n$ input ports and output ports, e.g. 2, 4, 8, or 16 ports, suffers from less losses than Butler matrixes having any other number of ports.

In FIG. 4 and FIG. 7, the power sharing network input port 423 is connected to ground while the inverse power sharing network output port 435 is connected to a monitor 436. The monitor 436 checks that no signal is received on the output port 435, i.e. that the output port 435 is at ground level. If in fact a signal other than ground is received by the monitor at the output port 435, this is an indication that there is a malfunction somewhere in the power amplifying unit 402 and the monitor may provide an error indication to operation and maintenance personnel.

The cellular network 101 applies power control to transmissions in the downlink direction of all cells C1–C5. Applying power control in the downlink direction means that the transmission power for a time slot on a radio carrier in the downlink direction, is adapted to the actual power needed for radio signals to reach a mobile station with sufficient signal strength. In TIA/EIA-136-131-A "Digital Traffic Channel Layer 1", a Fast Power Control (FPC) bit is specified for use in both the uplink and downlink directions. The mobile station measures the received signal quality and requests the first base station to increase or decrease the transmission power by setting the FPC-bit either to 1 or 0 in its transmissions on the corresponding time slot in the uplink direction. The first base station BS1 integrates the received increase/decrease requests in several consecutive FPC-bits to determine whether the downlink transmission power should be adjusted, and hence the mobile station can request the first base station BS1 to maintain the present output power by transmitting an alternating FPC-bit pattern.

The first base station BS1 is designed to benefit from the previously discussed statistical reduction in required output power caused by application of power control in the down link direction. The first base station BS1 may e.g. be designed to support simultaneous transmission of five radio frequency carriers in each of the cells C1–C3, i.e. the power amplifying unit 402 is designed to deliver a total maximum output power supporting simultaneous transmission of 15 radio frequency carriers. An antenna feeder would typically need to be fed with 11 Watt for downlink transmission of a single radio frequency carrier. Thus, without any power reducing functions, such as downlink power control, the power amplifying unit would have to be designed to deliver a total maximum output power of about 165 Watt. Due to the use of downlink power control, which for 15 radio frequency carriers causes a statistical reduction in the required output power of about 3.9 dB or about 2.5 times, it is however sufficient that the power amplifying unit 402 is designed to deliver about 66 Watt.

As a comparision, a base station designed to support simultaneous transmission of five radio frequency carriers in three cells, but having separate power amplifying units for each cell would also have to be designed to deliver a total maximum output power of about 165 Watt if no downlink power reducing functions are used. Using downlink power control in each cell, would mean a statistical reduction in the required output power of each separate power amplifying unit of only about 2 dB or about 1.6 times and the total maximum output power required would be about 103 Watt.

Figure 8:
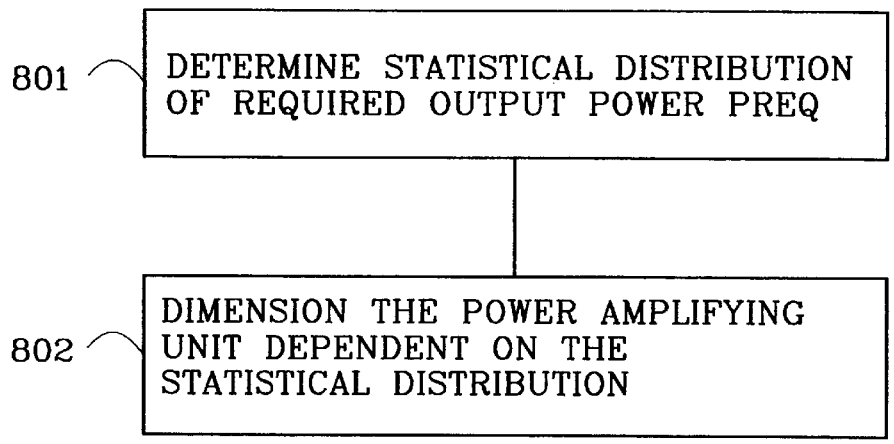
FIG. 8 is a flow diagram illustrating a method for dimensioning a power amplifying unit in the first base station.

FIG. 8 illustrates in more general terms the method according to which the power amplifying unit 402 is dimensioned, i.e. its maximum output power is selected.

At step 801, a statistical distribution is determined of the required total output power $P_{REQ}$ of the power amplifying unit 402 for simultaneous transmission of upto a defined maximum number $N^{max}$ of radio frequency carriers in the set of cells C1–C3 for which the power amplifying unit 402 performs power amplification. In this particular instance, the power amplification unit 402 performs power amplification of all the radio frequency carriers transmitted by the first base station BS1 in all three cells C1–C3 served by the first base station BS1, i.e. the power amplifying unit 402 needs to be able to support a maximum of 15 radio frequency carriers.

Figure 9:
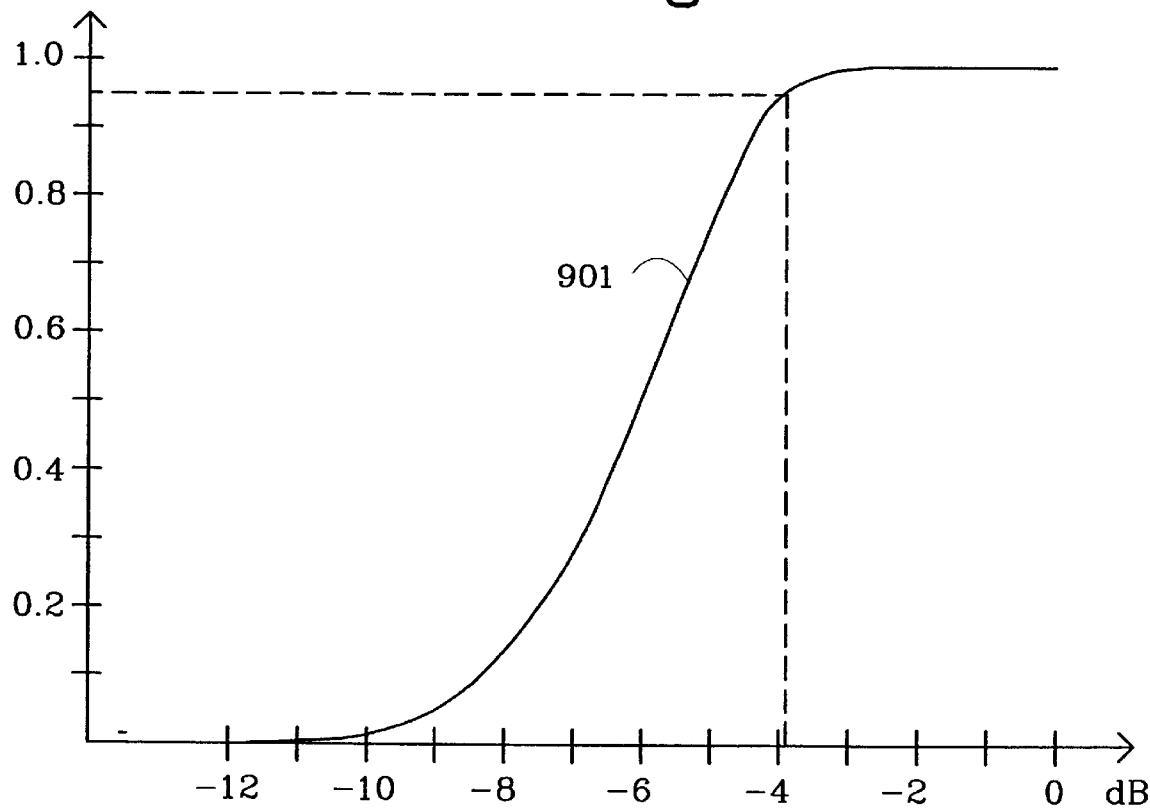
FIG. 9 is a diagram illustrating a cummulative distribution function of required output power.

As an example, FIG. 9 illustrates a cumulative distribution function 901 of the required total output power $P_{REQ}$ of the power amplifying unit 402 when the first base station BS1, using upto 15 radio frequency carriers, is operating under traffic conditions causing a blocking probability of 1%. Along the horizontal axis, the required total output power PREQ is expressed in terms of how much the total output power is reduced as compared to a total output power corresponding to maximum transmit power on 15 carriers, i.e. 165 Watt. Note that it is only during busy hours that the first base station BS1 is operating with a blocking probability as high as 1%.

At step 802 the power amplifying unit 402 is dimensioned dependent on the statistical distribution determined at step 801. The power amplifying unit 402 is dimensioned for delivering a total maximum output power which provides an acceptable non-zero probability that the power amplifying unit 402 will be incapable of providing enough output power for simultaneous transmission of the defined maximum number of radio frequency carriers. In this particular instance, a probability of 5% that the power amplifying unit 402 can not provide enough output power when the first base station BS1 is operating under traffic conditions causing a blocking probability of 1% is considered acceptable and hence, based on the cumulative distribution function 901 in FIG. 9, the power amplifying unit 402 is designed to deliver a total maximum output power of 66 Watt, i.e. 3.9 dB less than 165 Watt.

The cellular network 101 furthermore employs an Adaptive Channel Allocation scheme allowing the set of frequencies allocated for use in each individual cell C1–C3 to be adapted to changes in capacity demand. The channel allocation scheme used in the cellular network 101 in FIG. 1 is based on a fixed channel allocation scheme according to FIG. 2 complemented by the capability of temporarily allocating a borrowed channel for use in a cell requiring additional frequencies to serve the current capacity demand. Thus, at any given moment in time, the set of frequencies allocated to a cell comprises a basic set of frequencies allocated according to the basic fixed channel allocation scheme, excluding any frequencies borrowed for use in other cells, and may also comprise a set of additional frequencies borrowed from other cells.

Figure 5B:
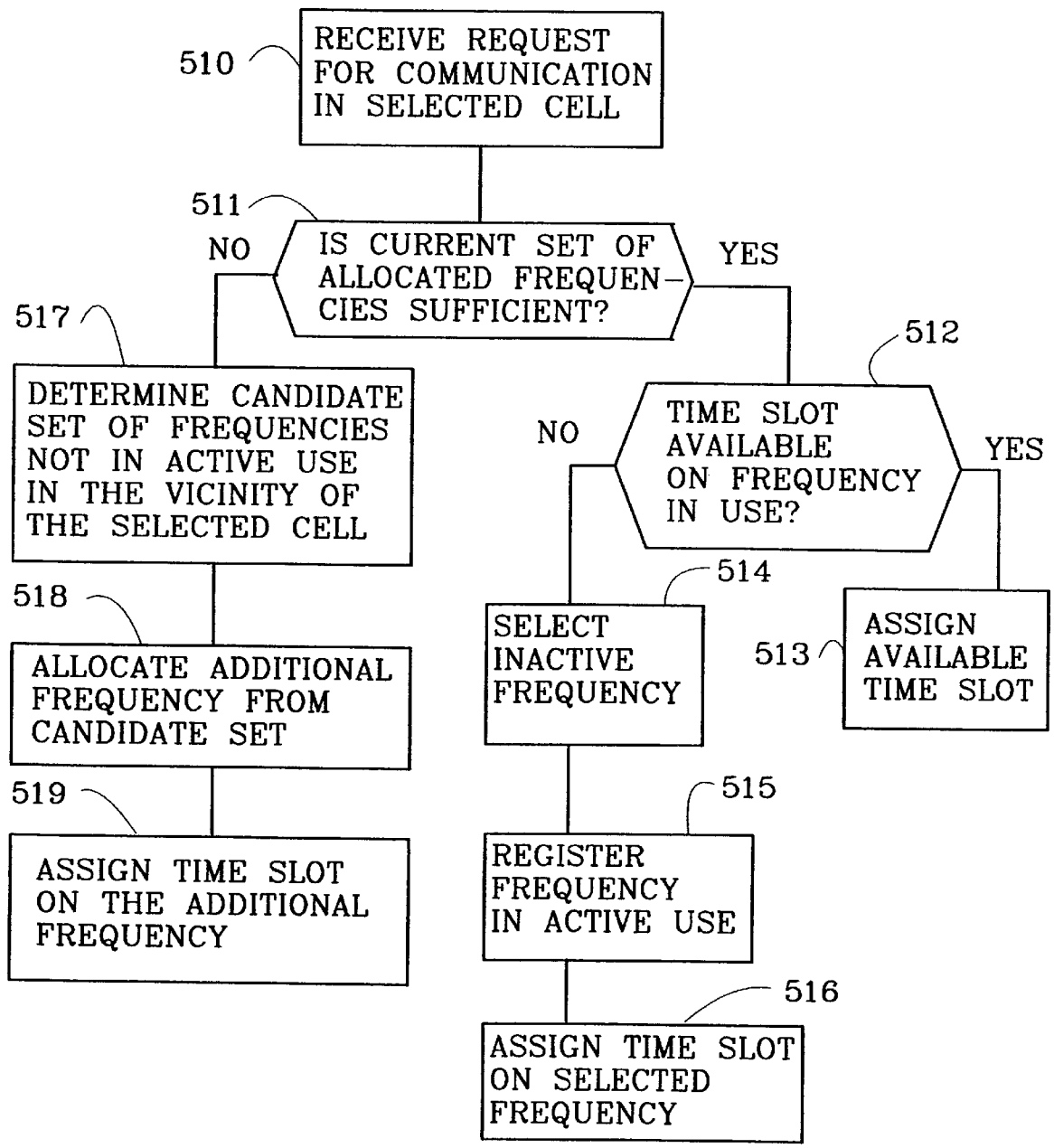
Figure 5C:
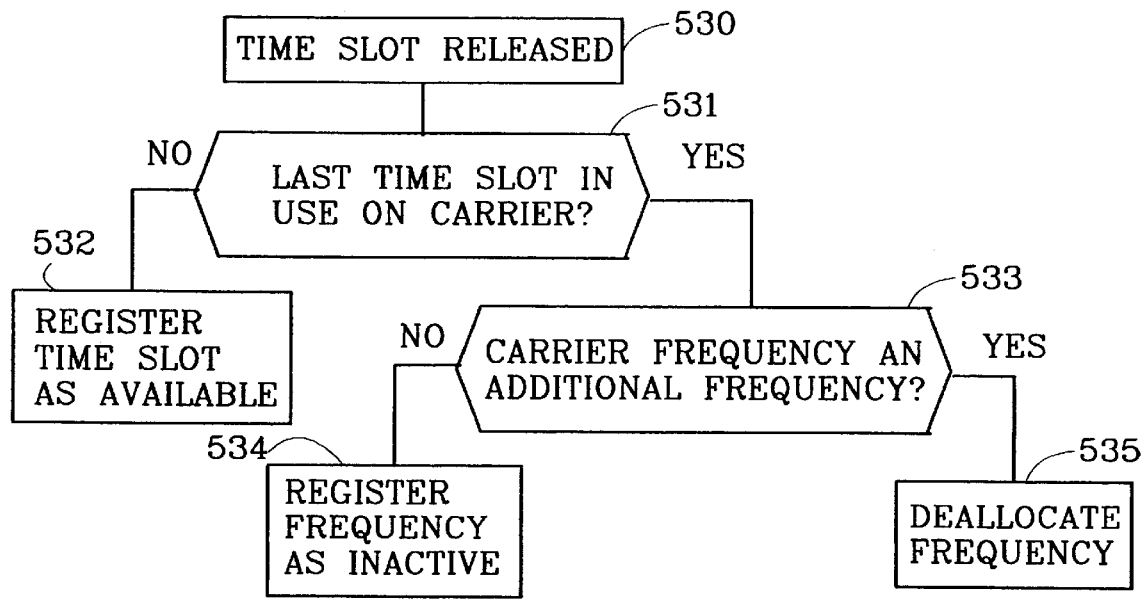

FIGS. 5B and 5C illustrates the Adaptive Channel Allocation scheme used in the cellular network 101 according to the first exemplifying embodiment of the invention.

At step 510 in FIG. 5B a request for communication in a selected one of the cells C1–C3 is received by the mobile services switching centre MSC1. The selected cell may e.g. be cell C1.

At step 511 the mobile services switching centre MSC1 determines whether the set of frequencies allocated for use in the selected cell C1 is sufficient to service the request for communication.

If the set of frequencies is determined to be sufficient (an alternative YES), a check is made at step 512 whether there is spare capacity, i.e. if there is an available time slot, on a frequency already in use. If there is an available time slot on a frequency already in use (an alternative YES), the available time slot is assigned at step 513 to service the communication request. If there are several allocated frequencies on which there are available time slots, the mobile services switching centre MSC1 tries to assign a time slot on a frequency in the basic set of frequencies before assigning a time slot on a frequency in the set of additional frequencies.

If it was determined at step 512 that there is no available time slot on the frequencies already in use (an alternative NO), a new frequency is brought into active use. Thus, at step 514 a frequency allocated to the cell C1, but not in active use, is selected, at step 515 the selected frequency is registered as being in active use and at step 516 a time slot on the selected frequency is assigned to service the communication request.

If it was determined at step 511 that the set of frequencies currently allocated to the cell C1 is insufficient to service the communication request (an alternative NO), the mobile services switching centre MSC1 proceeds at step 517 to determine a candidate set of frequencies allocated for use in the cellular network 101 but which are currently not in active use for communication in the vicinity of the cell C1. In the first embodiment of the invention, it is sufficient to include one candidate frequency in the candidate set of frequencies. At step 517 the mobile services switching centre MSC1 uses configuration data stored in the memory units 441 to determine which cells are in the vicinity of the cell C1 and examines the registered status of frequencies, i.e. whether they are registered in the memory units 441 as being in active use for communication or inactive, in said cells. Finding a candidate frequency is performed in two steps. First a potential candidate frequency is identified among the frequencies belonging to the basic set of frequencies allocated to cells immediately adjacent to the cell C1 and preferrably allocated to one of the other cells C2–C3 served by the first base station (BS1). Then a check is made that the potential candidate frequency is not in active use in any cell within a distance corresponding to the re-use distance, i.e. the distance between two cells allocated the same basic set of frequencies according to the employed "4/12" cell reuse pattern, of cell C1. This way it is ensured that no significant additional cochannel interference is introduced in the cellular network 101 when the candidate frequency is temporarily allocated for use in the cell C1.

At step 518 the mobile services switching centre MSC1 borrows, i.e. temporarily allocates, the candidate frequency as an additional frequency for use in the cell C1. To effect this temporary allocation of the candidate frequency to the cell C1, the candidate frequency is temporarily deallocated, i.e. marked as unavailable, in cells in the vicinity of cell C1. Thus, as long as the candidate frequency is allocated to cell C1, it will not be used for communication in cells in the vicinity of the cell C1.

At step 519 a time slot on the additional frequency is assigned to service the communication request.

FIG. 5C illustrates a sequence of steps performed when a communication session is finished.

At step 530 in FIG. 5C a time slot is released. At step 531 a check is made whether the released time slot was the last time slot in use on a radio frequency carrier. If the time slot was not the last time slot (an alternative NO), i.e. the radio frequency carrier is still in active use for communication, the time slot is marked as available at step 532. If the time slot was indeed determined to be the last time slot at step 531 (an alternative YES), a check is made at step 533 whether the radio carrier frequency is an additional frequency and hence only temporarily assigned to the cell C1. If the radio carrier frequency is not an additional frequency (an alternative NO), the radio carrier frequency is registered as being inactive at step 534. If the radio carrier frequency is in fact an additional frequency, the radio carrier frequency is deallocated from cell C1 at step 535, i.e. the frequency is once more made available for use in those cells in the vicinity of cell C1 where the frequency is part of a basic set of frequencies allocated to said cells.

In an alternative way of deallocating a temporarily allocated additional frequency in cell C1, a check could be made each time a time slot is released whether there is enough capacity within the basic set of frequencies in the cell to handle the ongoing communication sessions and if so, moving communication sessions from the additional frequency to frequencies in the basic set of frequencies and then deallocating the additional frequency.

Apart from the examplifying first embodiment of the invention disclosed above, there are several ways of providing rearrangements, modifications and substitutions of the first embodiment resulting in additional embodiments of the invention.

There are several alternative ways the power amplifying unit of the first base station BS1 could be implemented apart from the specific embodiment disclosed in FIG. 4 and FIG. 7. Examples of other ways of arranging the power amplifying unit can be found in e.g. U.S. Pat. No. 5,854,611 and U.S. Pat. No. 4,618,813.

Instead of having the first base station BS1 service each individual cell using a single antenna beam, as illustrated in FIG. 4, several narrow antenna beams could be used to service each individual cell. In this embodiment of the invention, the first and second set of radio signal's would include not only one but several radio signals associated with each respective cell. There would be one low power radio signal in the first set of radio signals and a corresponding amplified radio signal in the second set of radio signals for each narrow antenna beam.

Instead of serving three cells C1–C3, the first base station BS1 could be adapted to serve only two cells or more than three cells. Furthermore, the first base station BS1 could be adapted to serve cells arranged in an hierarchical cell structure e.g. by serving an additional umbrella cell providing radio coverage in an area overlapping at least one of the cells C1–C3.

In the first embodiment of the invention the mobile services switching centre MSC1 and more specifically the control processors 440 and the memory units 441 perform a multitude of different tasks and in particular act as:

control means, for controlling the set of radio carrier componenets included by the radio signal generating means 401 in each signal in the first set of radio signals S11–S13;

adaptive means, for adapting the set of frequencies allocated for use in the cells C1–C3;

registering means for registering which frequencies are currently in active use for communication.

It is of course possible that some of these tasks are instead performed in e.g. a base station controller (BSC) or some other kind of radio network controller (RNC) in a terrestrial cellular network.

In the context of the present invention, it is possible to apply any power reducing function in the downlink direction to achieve statistical reductions in the required total output power for transmissions from a base station. It is of course possible to apply several different power reducing functions in combination to achieve even larger statistical reductions. Thus, when implementing the present invention in a GSM terrestrial cellular network, both downlink power control and discontinuous transmission according to the GSM-specifications could, and preferrably should, be used. It is of course also conceivable to add some kind of downlink discontinuous transmission scheme to future revisions of the TIA/EIA IS-136 specifications, e.g. based on the uplink discontinuous transmission scheme currently specified in TIA/EIA IS-136, and to modify the first embodiment of the invention described previously to apply and benefit from the combined use of downlink power control and discontinuous transmission.

In the first embodiment of the invention, whenever the required output power from the power amplifying unit 402 in a time slot exceeds the power amplifying capacity of the power amplifying unit 402, the power amplifying unit 402 will be incapable of providing enough output power for transmission of bursts on all active radio frequency carriers in the time slot.

One way of handling occurences of situations where the power amplifying unit 402 is unable to deliver enough output power, is to refrain from transmitting bursts on one or several active radio frequency carriers so as to ensure that the power amplifying capacity of the power amplifying unit 402 is not exceeded. The carriers on which no bursts are transmitted, can e.g. be selected randomly.

Another way of handling these situations, is to transmit bursts on all active radio frequency carriers but with reduced power on one or several radio frequency carriers so as to ensure that the power amplifying capacity of the power amplifying unit 402 is not exceeded. For an example, the transmit power on all active radio frequency carriers can be reduced equally much. If reducing the transmit power on all active radio frequency carriers enables the transmit power on some of the radio frequency carriers to be increased, the transmit power of the carriers with the lowest transmit power is increased first. Alternatively, instead of reducing the transmit power of all active radio carrier frequencies, the transmit power of the strongest radio carrier frequencies can be reduced first.

The Adaptive Channel Allocation scheme used in the first embodiment of the invention is but one example of a multitude of different ACA-schemes which can be used in the context of the present invention.

Instead of selecting an additional frequency for allocation in a selected cell based on the mobile services switching centres knowledge of which frequencies in cells in the vicinity of the selected cell are actually in active use for communication, the selection can be based on measurements in the selected cell of interference levels on frequencies currently not allocated to the selected cell. In this scheme, the additional frequency selected for allocation to the cell is a measured frequency which is determined to experience interference below a predetermined level. Measurements can be initiated upon receipt of a request for communication in the selected cell when detecting that the set of frequencies allocated for use in the selected cell is insufficient to service the request for communication. However, in order to not introduce unnecessary delays in serving the request for communication, interference level measurements are preferably performed continuously. The measurements can be performed by a scanning receiver in the base station serving the selected cell as suggested in the published international patent application WO 97/32444.

As a person skilled in the art appreciates, application of the invention is in no way limited to only terrestrial cellular radio communication networks conforming to the EIA/TIA IS-136 specifications. Thus, as long as the cellular network includes base stations serving several cells, the invention is also applicable in cellular networks adhering to e.g. the GSM-, PDC, AMPS, TACS, NMT, or IS-95 specifications and evolutions of these specifications such as EDGE or GPRS.

What is claimed is:

1. A terrestrial cellular radio communication network (101) comprising at least a first base station (BS1), the first base station (BS1) comprising:
   radio signal generating means (401) adapted to generate a first set of low power radio signals (S11–S13) comprising at least a first radio signal (S11) and a second radio signal (S12);
   a power amplifying unit (402) adapted to generate a second set of amplified radio signals (S21–S23) corresponding to the first set of radio signals (S11–S13) by amplifying the first set of radio signals using a common set of multi carrier power amplifiers (409–412);
   an antenna system (403) adapted to radiate the second set of amplified radio signals (S21–S23) in associated antenna beams (417–419),
   the cellular radio communication network (101) further comprising:
   control means (440, 441) for controlling the set of radio carrier components included by the radio signal generating means (401) in each signal in the first set of radio signals (S11–S13),
   wherein the control means (440, 441) are adapted to instruct the radio signal generating means (401) to generate the first radio signal (S11) so as to consist of radio carrier components having frequencies allocated for use in a first cell (C1) of the cellular radio communication network (101) and the antenna system (403) is adapted to radiate the amplified radio signal (S21) corresponding to the first radio signal (S11) in an antenna beam (417) associated with the first cell (C1),
   characterized in that the control means (440, 441) are adapted to instruct the radio signal generating means (401) to generate the second radio signal (S12) so as to consist of radio carrier components having frequencies allocated for use in a second cell (C2) of the cellular radio communication network (101) and the antenna system (403) is adapted to radiate the amplified radio signal (S22) corresponding to the second radio signal (S12) in an antenna beam (418) associated with the second cell (C2).

2. A terrestrial cellular radio communication network (101) according to claim 1, wherein the power amplifying unit (402), in addition to the common set of multi carrier power amplifiers (409–412), comprises a power sharing network (408) and an inverse power sharing network (413), the power sharing network (408) and the inverse power sharing network (413) both having a plurality of input and output ports (420–435), amplifiers in the common set of multi carrier power amplifiers (409–412) each having an input port connected to an output port of the power sharing network (408) and an output port connected to an input port of the inverse power sharing network (413),
   the power sharing network (408) is adapted to provide a third set of radio signals (S31–S34) on its output ports (424–427) by receiving the first set of radio signals (S11–S13) on its input ports (420–422) and distributing portions of each signal (S11–S13) in the first set of radio signals to each of its output ports (424–427),
   the common set of multi carrier power amplifiers (409–412) is adapted to provide a fourth set of radio signals (S41–S44) by amplifying in each multiple carrier power amplifier the signal in the third set of radio signals received on its input port,
   the inverse power sharing network (413) is adapted to provide the second set of radio signals (S21–S23) on its output ports (432–434) by receiving the fourth set of radio signals (S41–S44) on its input ports (428–431) and performing the inverse operation of the power sharing network (408).

3. A terrestrial cellular radio communication network (101) according to claim 2, wherein the power sharing network (408) is adapted to distribute each signal in the first set of radio signals (S11–S13) in portions of substantially equal power levels to each of its output ports (424–427).

4. A terrestrial cellular radio communication network (101) according to any one of claims 2–3, wherein the power sharing network (408) is adapted to distribute the portions of each signal in the first set of radio signals (S11–S13) staggered in phase to each of its output ports (424–427).

5. A terrestrial cellular radio communication network (101) according to claim 1, wherein the power amplifying unit (402) is adapted to perform power amplification of all radio frequency carriers transmitted downlink in a set of cells (C1–C3), including at least the first cell (C1) and the second cell (C2), served by the first base station (BS1) and the cellular radio communication network (101) is adapted to apply power reducing functions, such as downlink power control or discontinuous transmission, to transmissions in the downlink direction of the set of cells (C1–C3).

6. A method for dimensioning the power amplifying unit (402) in the first base station (BS1) of a terrestrial cellular radio communication network (101) according to claim 5, the method comprising the steps of:
   a) determining (801) a statistical distribution (901) of the required total output power of the power amplifying unit (402) for simultaneous transmission of upto a defined maximum number of radio frequency carriers in the set of cells (C1–C2);
   b) dimensioning (802) the power amplifying unit (402) dependent on the statistical distribution (901) determined at step a).

7. A method according to claim 6, wherein the power amplifying unit (402) is dimensioned at step b) for delivering a total maximum output power which provides an acceptable non-zero probability that the power amplifying unit (402) will be incapable of providing enough output power for simultaneous transmission of the defined maximum number of radio frequency carriers.

8. A terrestrial cellular radio communication network according to claim 1, wherein the cellular radio communication network comprises:
   adaptive means (440, 441) for adapting the set of frequencies allocated for use in at least one of said first and second cells (C1, C2) in response to predicted or actual changes in capacity demand in said at least one cell.

9. A terrestrial cellular radio communication network (101) according to claim 8, wherein the cellular radio communication network (101) further comprises
   receiving means (440, 441) for receiving a request for communication in a selected cell (C1) of said at least one cell (C1, C2),
   the adaptive means (440, 441) are adapted to determine whether the current set of frequencies allocated for use in the selected cell (C1) is sufficient to service the request for communication and, if the current set of frequencies is insufficient, allocate at least one additional frequency for use in the selected cell (C1).

10. A terrestrial cellular communication network (101) according to claim 9, wherein the cellular communication network (101) comprises
   registering means (440, 441) for registering which frequencies are currently in active use for communication in the vicinity of the selected cell (C1),
   the adaptive means (440, 441) are adapted to determine a candidate set of frequencies, comprising at least one frequency, which are allocated for use in the terrestrial cellular radio communication network (101) but are not currently in active use for communication in the vicinity of the selected cell (C1) and to select the at least one additional frequency from the candidate set of frequencies.

11. A terrestrial cellular communication network (101) according to claim 9, wherein the cellular radio communication network comprises
   measuring means for measuring interference levels in the selected cell (C1) on a set of frequencies currently not allocated to the selected cell (C1) and
   the adaptive means (440, 441) are adapted to select the at least one additional frequency as a frequency measured by the measuring means (BS1) and determined to experience interference below a predetermined level.

12. A terrestrial cellular communication network (101) according to claim 11, wherein the measuring means are adapted to continuously measure the interference levels in the selected cell (C1).

13. A terrestrial cellular communication network (101) according to claim 1, wherein the cellular communication network (101) comprises a mobile service switching centre (MSC1) to which the first base station (BS1) is connected and which includes at least one of the control means(440, 441), the adaptive means(440, 441), the receiving means (440, 441) and the registering means(440, 441).

14. A terrestrial cellular communication network (101) according to claim 11, wherein the first base station (BS1) includes the measuring means.

15. A method of transmitting radio signals (S21–S23) in a terrestrial cellular radio communication network (101) comprising at least a first base station (BS1), the method comprising the steps of in the first base station (BS1):
   a) generating (501) a first set of low power radio signals (S11–S13) comprising at least a first radio signal (S11) and a second radio signal (S12);
   b) generating (502–504) a second set of amplified radio signals (S21–S23) corresponding to the first set of radio signals (S11–S13) by amplifying the first set of radio signals (S11–S13) using a common set of multi carrier power amplifiers (409–412);
   c) radiating (505) the second set of amplified radio signals (S21–S23) in associated antenna beams (417–419),
      wherein the first radio signal (S11) is generated so as to consist of radio carrier components having frequencies allocated for use in a first cell (C1) of the cellular radio communication network (101) and the amplified radio signal (S21) corresponding to the first radio signal (S11) is radiated in an antenna beam (417) associated with the first cell (C1),
      characterized in that the second radio signal (S12) is generated so as to consist of radio carrier components having frequencies allocated for use in a second cell (C2) of the cellular radio communication network (101) and the amplified radio signal (S22) corresponding to the second radio signal (S12) is radiated in an antenna beam (418) associated with the second cell (C2).

16. A method according to claim 15, wherein the generating step
   b) comprises the substeps of:
   d) providing (502) a third set of radio signals (S31–S34) by distributing a portion of each signal in the first set of radio signals (S11–S13) into each signal in the third set of radio signals (S31–S34);
   e) providing (503) a fourth set of radio signals (S41–S44) by amplifying each signal in the third set of radio signals (S31–S34) in one of the multiple carrier power amplifiers (409–412);
   f) providing (504) the second set of radio signals by performing the inverse operation of step d) on the fourth set of radio signals (S41–S44).

17. A method according to claim 16, wherein each signal in the first set of radio signals (S11–513) is distributed in portions of substantially equal power levels.

18. A method according to any one of claims 16 or 17, wherein the portions of each signal in the first set of radio signals (S11–S13) are distributed staggered in phase.

19. A method according to claim 15, wherein the terrestrial cellular radio communication network (101) applies power reducing functions, such as downlink power control or discontinuous transmission, to transmissions in the downlink direction of a set of cells (C1–C3), including at least the first cell (C1) and the second cell (C2), served by the first base station (BS1).

20. A method according to claim 15, wherein the method comprises a further step of:
  g) adapting (511–518) the set of frequencies allocated for use in at least one of said first and second cells (C1, C2) in response to predicted or actual changes in capacity demand in said at least one cell.

21. A method according to claim 20, wherein step g) comprises the sub steps of:
  h) receiving (510) a request for communication in a selected cell (C1) of said at least one cell (C1, C2);
  i) determining (511) that the current set of frequencies allocated for use in the selected cell (C1) is insufficient to service the request for communication;
  j) allocating (518) at least one additional frequency for use in the selected cell (C1).

22. A method according to claim 21, wherein step g) comprises the substeps of:
  k) registering (515, 532) which frequencies are currently in active use for communication in the vicinity of the selected cell (C1);
  l) determining (517) a candidate set of frequencies, comprising at least one frequency, which are allocated for use in the terrestrial cellular radio communication network (101) but are not currently in active use for communication in the vicinity of the selected cell (C1), wherein the at least one additional frequency allocated in step j) is selected from the candidate set.

23. A method according to claim 23, wherein step g) also comprises the steps of:
  m) measuring interference levels in the selected cell (C1) on a set of frequencies currently not allocated to the selected cell (C1), wherein the at least one additional frequency allocated in step j) is a frequency measured in step m) and determined to experience interference below a predetermined level.

24. A method according to claim 23, wherein the measuring step m) is performed continuously.

25. A method according to claim 23, wherein the measuring step m) is initiated upon receiving the request for communication at step h).

* * * * *